United States Patent
Chen et al.

(10) Patent No.: US 7,129,140 B2
(45) Date of Patent: Oct. 31, 2006

(54) METHOD OF FORMING POLYSILICON GATE STRUCTURES WITH SPECIFIC EDGE PROFILES FOR OPTIMIZATION OF LDD OFFSET SPACING

(75) Inventors: Cheng-Ku Chen, Hsinchu (TW); Min-Hwa Chi, Palo Alto, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 155 days.

(21) Appl. No.: 10/798,178

(22) Filed: Mar. 11, 2004

(65) Prior Publication Data
US 2005/0202642 A1   Sep. 15, 2005

(51) Int. Cl.
*H01L 21/336* (2006.01)

(52) U.S. Cl. .................... 438/301; 438/302; 438/303

(58) Field of Classification Search .................... None
See application file for complete search history.

(56) References Cited

U.S. PATENT DOCUMENTS

| | | | | |
|---|---|---|---|---|
| 5,707,883 | A | * | 1/1998 | Tabara .................. 438/297 |
| 5,807,779 | A | * | 9/1998 | Liaw .................... 438/279 |
| 5,834,817 | A | * | 11/1998 | Satoh et al. .......... 257/387 |
| 6,025,240 | A | | 2/2000 | Chan et al. ........... 438/303 |
| 6,187,644 | B1 | | 2/2001 | Lin et al. .............. 438/303 |
| 6,294,432 | B1 | | 9/2001 | Lin et al. .............. 438/301 |
| 6,350,639 | B1 | | 2/2002 | Yu et al. ............... 438/199 |
| 6,514,830 | B1 | | 2/2003 | Fang et al. ........... 438/302 |
| 2004/0157397 | A1 | * | 8/2004 | Quek .................... 438/305 |

OTHER PUBLICATIONS

Lee, H.C., et al., "Reduction of Plasma Process-Induced Damage During Gate Poly Etching by Using a SiO2 Hard Mask", 3rd International Symposium on Plasma Process-Induced Damage, Jun. 4-5, 1998, pp. 72-75.

Nakai, S., et al., "A 100 nm CMOS Technology with "Sidewell-Notched" 40 nm Transistors and SiC-Capped Cu/VLK Interconnects for High Performance Microprocessor Applications", Symposium on VLSI Technology Digest of Technical Papers, 2002, pp. 66-67.

Pidin, S., et al., "Experimental and Simulation Study on Sub-50 nm CMOS Design", Symposium on VLSI Technology Digest of Technical Papers, 2001, pp. 35-36.

(Continued)

*Primary Examiner*—Michael Lebentritt
*Assistant Examiner*—Cheung Lee
(74) *Attorney, Agent, or Firm*—Haynes and Boone, LLP

(57) ABSTRACT

Methods of forming MOSFET devices featuring LDD regions offset from the edges of conductive gate structures has been developed. A first embodiment of this invention features the definition of a tapered conductive gate structure with the foot of the tapered structure larger in width than the top of the structure. Formation of an LDD region is accomplished in regions of the semiconductor substrate not covered by the tapered conductive structure. A dry etch procedure is next used to remove the foot of the tapered conductive structure resulting in an LDD region being offset from the edges of a now straight walled conductive structure. A second embodiment of this invention entails the definition of a conductive gate structure featuring notches located at the bottom of the conductive gate structure, extending inwards. Formation of an LDD region is again accomplished in regions of the semiconductor substrate not underlying the non-notched portion of the conductive gate structure, resulting in the LDD region being offset from the notched edges of the conductive gate structure.

27 Claims, 5 Drawing Sheets

OTHER PUBLICATIONS

Tomita, K., et al., "Sub-1um2 High Density Embedded SRAM Technologies for 100nm Generation SOC and Beyond", Symposium on VLSI Technology Digest of Technical Papers, 2002, pp. 14-15.

Tsuchiya, Ryuta, et al., "Femto-Second DMOS Technology with High-K Offset Spacer and SiN Gate Dielectric with Oxygen-Enriched Interface", Symposium on VLSI Technology Digest of Technical Papers, 2002, pp. 150-151.

Wakabayashi, H., et al., "A 0.10-um CMOS Device with a 40-nm Gate Sidewall and Multilevel Interconnects for System LSI", Symposium on VLSI Technology Digest of Technical Papers, 1999, pp. 107-108.

Yanagiya, N., et al., "65nm CMOS Technology (CMOS5) with High Density Embedded Memories for Broadband Microprocessor Applications", Electron Devices Meeting, IEDM '02 Digest International, 2002, pp. 57-60.

* cited by examiner

METHOD OF FORMING POLYSILICON GATE STRUCTURES WITH SPECIFIC EDGE PROFILES FOR OPTIMIZATION OF LDD OFFSET SPACING

BACKGROUND OF THE INVENTION (1) Field of the Invention

The present invention relates to methods used to fabricate semiconductor devices, and more specifically to methods used to form lightly doped source/drain (LDD) regions for metal oxide semiconductor field effect transistor (MOSFET) devices.

(2) Description of Prior Art

Lightly doped source/drain (LDD) regions have been used to improve MOSFET device reliability via a reduction of a hot electron injection phenomena. However as MOSFET or complimentary metal oxide semiconductor (CMOS) technology advances into 0.10 µm generation and beyond there is a need to reduce the possibility of compensation of the already narrow channel region that can occur via lateral diffusion of the adjacent LDD implanted dopants. Offset insulator spacers formed on the sides of a conductive gate structure prior to formation of the LDD region do offer the desired additional spacing between the channel and LDD implanted regions. The use of offset spacers however increase device fabrication costs via the use of additional process steps such as deposition of the offset spacer insulator layer as well as the dry etch procedure needed to define the offset spacers.

The present invention will describe methods of offsetting the LDD implanted regions from the MOSFET channel region without formation of offset insulator spacers thus avoiding the additional process costs inherent in the definition of the insulator offset spacers. This invention will describe the formation of conductive gate structures featuring specific edge profiles which will allow the LDD implanted regions to be offset from the channel region, accomplished without additional process steps. Prior art such as Fang et al, in U.S. Pat. No. 6,514,830 B1, Yu et al, in U.S. Pat. No. 6,350,639, B1, Chan et al, in U.S. Pat. No. 6,025,240, Lin et al, in U.S. Pat. No. 6,187,644 B1, and Lin et al, in U.S. Pat. No. 6,294,432 B1, describe methods of forming offset insulator spacers as well as methods of forming ion implanted LDD regions. None of the above prior art however describe the novel procedures featured in the present invention in which the edge profile of a conductive gate structure is specifically engineered and then used to offset an LDD region subsequently formed via ion implantation procedures.

SUMMARY OF THE INVENTION

It is an object of this invention to form an offset LDD implanted region for a MOSFET device, featuring a space located between the LDD implanted region and the MOSFET channel region which is located directly underlying a conductive gate structure.

It is another object of this invention to form the offset LDD region via implantation of ions into a region of a semiconductor substrate not covered by a tapered conductive gate structure, wherein the tapered conductive gate structure is wider at the bottom than at the top.

It is still another object of this invention form the offset LDD region via implantation of ions into a region of a semiconductor substrate not covered by a conductive gate structure, wherein the conductive gate structure is undercut, or formed with notches at the bottom of the conductive gate.

In accordance with the present invention methods of forming an LDD implanted region for a MOSFET device, wherein the LDD implanted region is offset from the portion of semiconductor substrate underlying a conductive gate structure, accomplished via use of tapered or notched conductive gate structures as a mask against implantation, is described. A first embodiment of this invention employs an insulator to be used as a hard mask to allow a dry etch procedure to define a tapered conductive gate structure on an underlying gate insulator layer. The dry etch parameters allow the tapered conductive gate structure formed with a larger bottom width, (located at the interface of the tapered conductive gate structure—gate insulator layer), when compared to a narrower top width, (located at the mask shape—tapered conductive gate structure interface). An implantation procedure then forms an LDD region in an area of the semiconductor substrate not covered by the tapered conductive gate structure, as well as placing implanted ions in the sides of the tapered conductive gate structure, with the concentration of implanted ions and the associated implant damage in the tapered conductive gate structure decreasing as the width of the tapered conductive gate structure decreases. Another dry etch procedure is used to trim the conductive gate structure removing the portions of the tapered conductive gate comprised with the larger concentration of implanted ions and larger degree of implant damage, faster than removal of regions of the same tapered conductive gate structure featuring less a concentration of implanted ions and less degree of implant damage, resulting in a more vertical, non-tapered conductive gate structure and offsetting the LDD implanted region from the edges of the non-tapered conductive gate structure. Formation of insulator spacers on the sides of the non-tapered conductive gate structure is followed by formation of a heavily doped source/drain region in an area of the semiconductor substrate not covered by the non-tapered conductive gate structure or by the insulator spacers.

A second embodiment of this invention entails a dry etching procedure again using a mask shape as a hard mask, to define a conductive gate structure featuring notches or undercut portions at the interface of the conductive gate structure— gate insulator layer. An ion implantation procedure forms the LDD implanted region in an area of the semiconductor substrate not underlying the non-undercut top portion of the conductive gate structure, thus offsetting the LDD implanted region from the portion of semiconductor substrate underlying the portion of notched semiconductor substrate. Formation of insulator spacers on the sides of the notched conductive gate structure fills the undercut portions of the notched conductive gate structure and is followed by formation of a heavily doped source/drain region created via implantation of ions into an area of the semiconductor substrate not covered by the notched conductive gate structure or by the insulator spacers.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
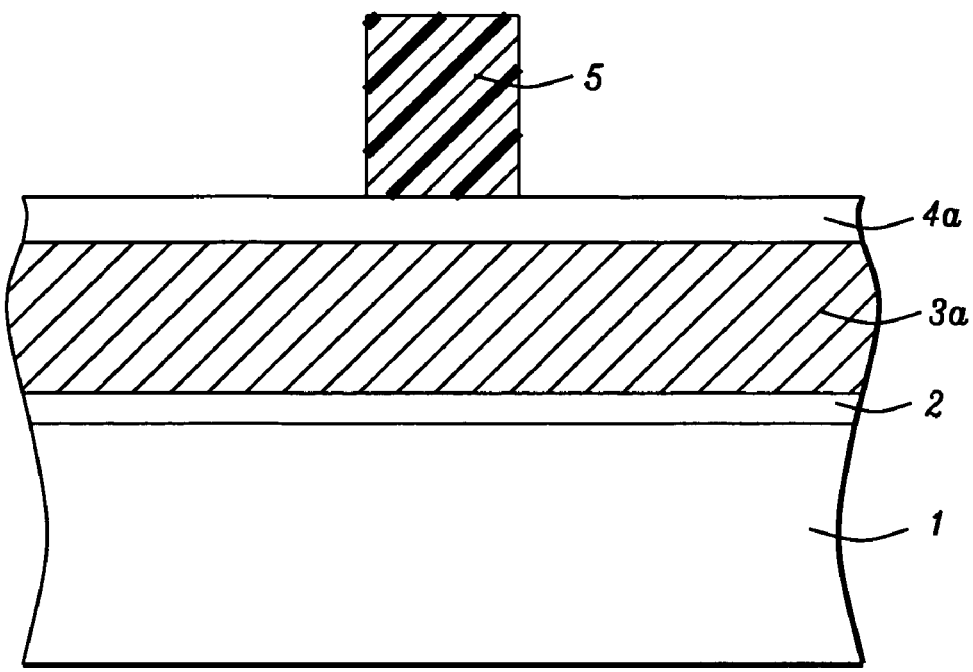
FIGS. 1–7, which schematically in cross-sectional style show a first embodiment of this invention in which an initially tapered conductive gate structure is used as a mask to allow definition of an LDD region to be accomplished in a first area of the semiconductor substrate offset from a second area of semiconductor substrate located underlying a final, non-tapered conductive gate structure.

Methods of forming an LDD region for a MOSFET device in a first portion of semiconductor substrate, wherein the LDD implanted region is offset from a MOSFET channel region located in a second portion of the semiconductor substrate, will now be described in detail. The offset LDD implanted regions featured in this invention can be employed for either N channel (NMOS) devices, for P channel (PMOS) devices, or for complimentary metal oxide semiconductor (CMOS) devices. For this description the offset LDD implanted regions will be applied to NMOS devices for conventional illustrations. Semiconductor substrate 1, comprised of P type single crystalline silicon, featuring a <100> crystallographic orientation, is used and schematically shown in FIG. 1. Gate insulator layer 2, comprised of silicon dioxide is thermally grown in an oxygen—steam ambient, to a thickness between about 10 to 80 Angstroms. Conductive layer 3a, comprised of a material such as doped polysilicon, is next deposited via low pressure chemical vapor deposition (LPCVD) procedures to a thickness between about 800 to 2000 Angstroms. The polysilicon layer can doped in situ during deposition via the addition of arsine or phosphine to a silane, or to a disilane ambient, or the polysilicon layer can be deposited intrinsically than doped via implantation of arsenic or phosphorous ions. Insulator layer 4a, a layer such as silicon nitride, silicon oxynitride, or silicon oxide is next formed on conductive layer 3a, at a thickness between about 200 to 800 Angstroms, via LPCVD or via plasma enhanced chemical vapor deposition procedures. Photoresist shape 5, is next defined on the top surface of insulator layer 4a, comprised with a width between about 800 to 1500 Angstroms. The result of these procedures is schematically shown in FIG. 1.

Figure 2:
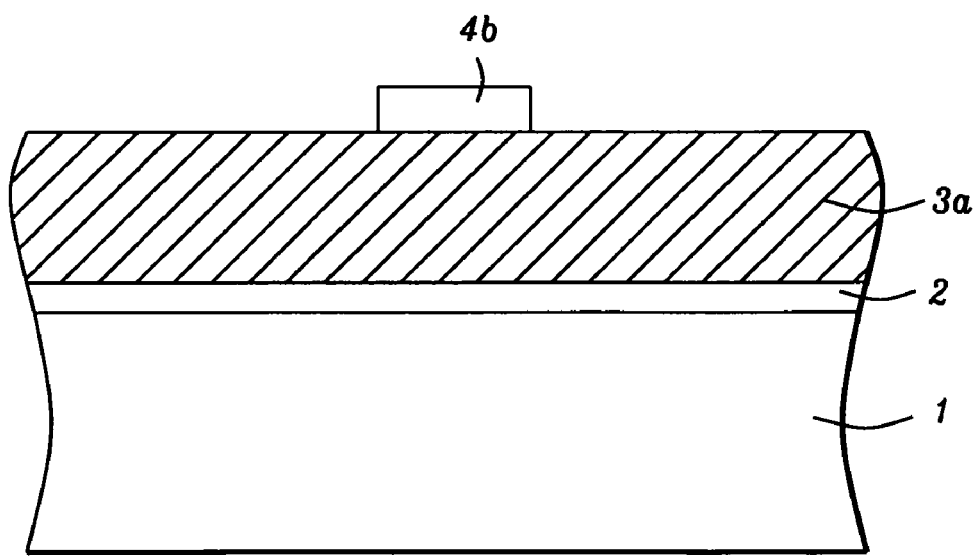

An anisotropic reactive ion etching (RIE) procedure is now employed to transfer the image of photoresist shape 5, to insulator layer 4a, accomplished using an etch chemistry featuring a high etch selectivity to conductive layer 3a. Carbon fluoride or carbon hydrofluoride etchants such as $CF_4$, $C_4F_8$, $CHF_3$ and $CH_2F_2$ can be used to define mask shape 4b, providing the desired high etch rate ratio of insulator layer 4a, to conductive layer 3a. After definition of hard mask shape 4b, photoresist shape 5, is removed via plasma oxygen ashing procedures. This is schematically shown in FIG. 2.

Figure 3:
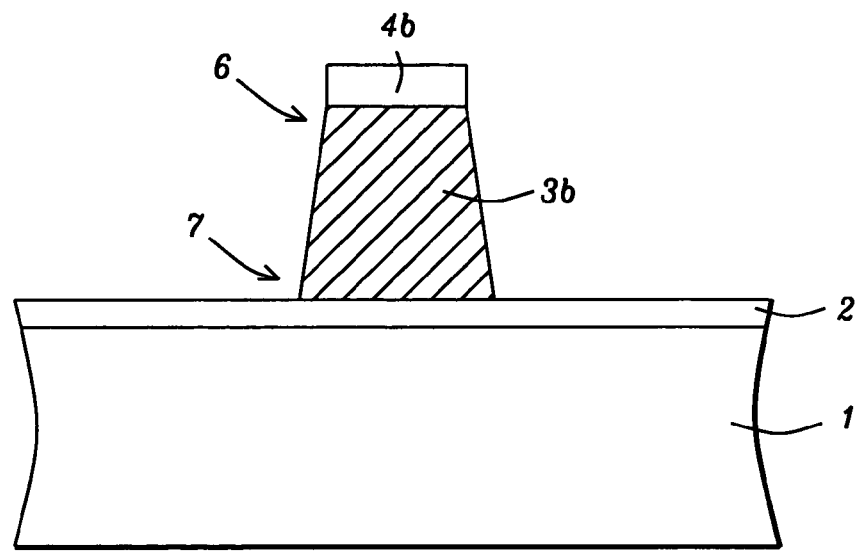

A critical dry etch procedure is next performed to define conductive gate structure 3b, featuring a trapezoidal shape, using mask shape 4b, as an etch mask. This is schematically shown in FIG. 3. To obtain conductive shape 3b, with tapered sides, a RIE procedure with multiple etching steps is employed at a power between about 500 to 800 watts at a pressure between about 5 to 15 mtorr for the first etch step, a power between about 300 to 500 watts and pressure between about 20 to 30 mtorr for a second etch step, and a power between about 300 to 500 watts and a pressure between about 50 to 80 mtorr for the third step, using an etch chemistry comprised with $Cl_2$, HBr, $O_2$ and He. The desired selectivity or high etch rate ratio of conductive layer 3a, to mask shape 4b, as well as the high etch rate ratio of conductive layer 3a, to insulator layer 2, is realized using the above dry etch conditions and etch chemistry. The desired taper of conductive gate structure 3b, features bottom width 7, of conductive gate structure 3b, between about 100 to 200 Angstroms greater than top width 6, of the same conductive gate structure at the mask shape—conductive gate structure interface. The taper of conductive gate structure 3b, will be critical for subsequently obtaining an offset LDD region.

Figure 4:
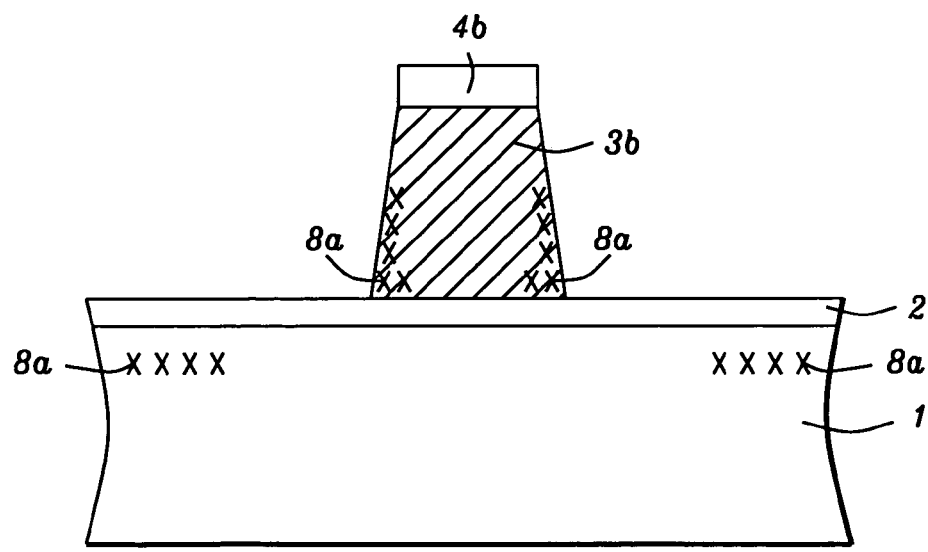

If desired pocket implant regions can be formed in regions of semiconductor substrate 1, not covered by conductive gate structure 3b. The pocket implant region, obtained via implantation of P type ions often with large tilt angles between about 20 to 45°, will provide a region featuring the same conductivity type as the semiconductor substrate but at a higher dopant concentration, thus reducing the risk of a depletion region punch through phenomena. For this description the P type pocket implant region will not be shown. The procedure used to define an offset LDD implanted region in an area of semiconductor substrate not covered by conductive gate structure 3b, is now addressed and schematically shown in FIG. 4. An ion implantation procedure at an energy between about 3 to 10 KeV, at a dose between about 1E12 to 1E14 atoms/$cm^2$, and at an implant angle 0, using arsenic or phosphorous ions, is next performed placing N type ions 8a, in regions of semiconductor substrate 1, not covered by conductive gate structure 3b, as well as placing the same N type ions 8a, in the tapered sides of the wider portions of conductive gate structure 3b. The concentration of N type ions 8a, and associated implant damage in conductive gate structure 3b, is roughly proportional to the width of conductive gate structure 3b, with the greater concentration of N type ions 8a, and degree of implant damage, located near the surface of the widest portions of conductive gate structure 3b.

Figure 5:
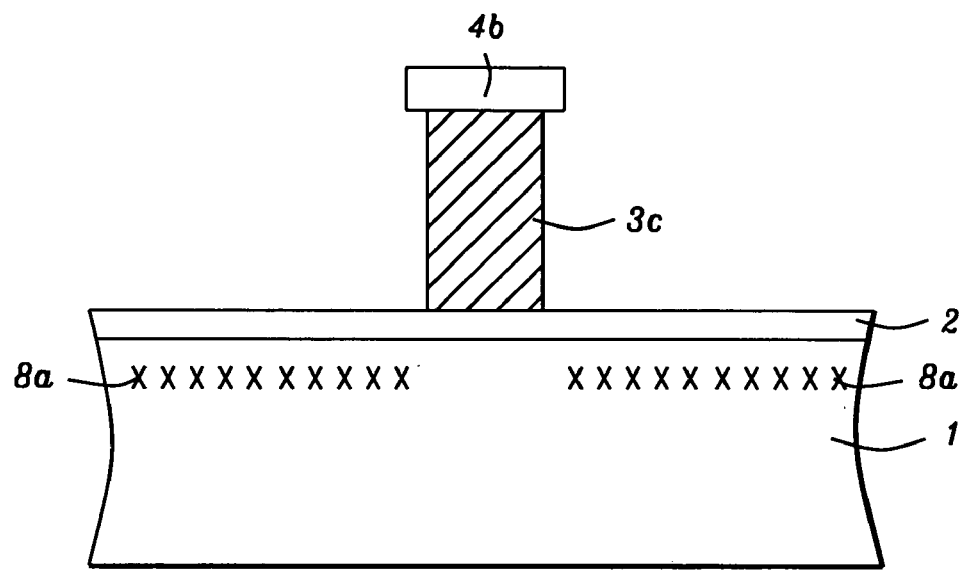

Another dry etch procedure is next employed to trim conductive gate structure 3b, and to form conductive gate structure 3c, now comprised with vertical sides. This is accomplished via a plasma etch procedure establishing the desired isotropic etch component via employment of a pressure between about 50 to 100 mtorr, using a gas mixture of $Cl_2$, HBr, $O_2$, and $N_2$ as a selective etchant for conductive gate structure material. In addition to the isotropic etch component of the plasma etch procedure, the presence of N type ions and implant damage in the tapered sides of the conductive gate structure influence the etch rate. The wider portions of conductive gate structure 3b, featuring higher concentration of N type ions 8a, and greater degree of implant damage, are removed at a faster rate than the narrower portions of conductive gate structure 3b. N type ions 8a, located in portions of semiconductor substrate 1, not covered by the conductive gate structure were protected by gate insulator layer 2, during the selective, plasma etch procedure. The result of this procedure, defining straight walled, conductive gate structure 3c, is schematically shown in FIG. 5.

Figure 6:
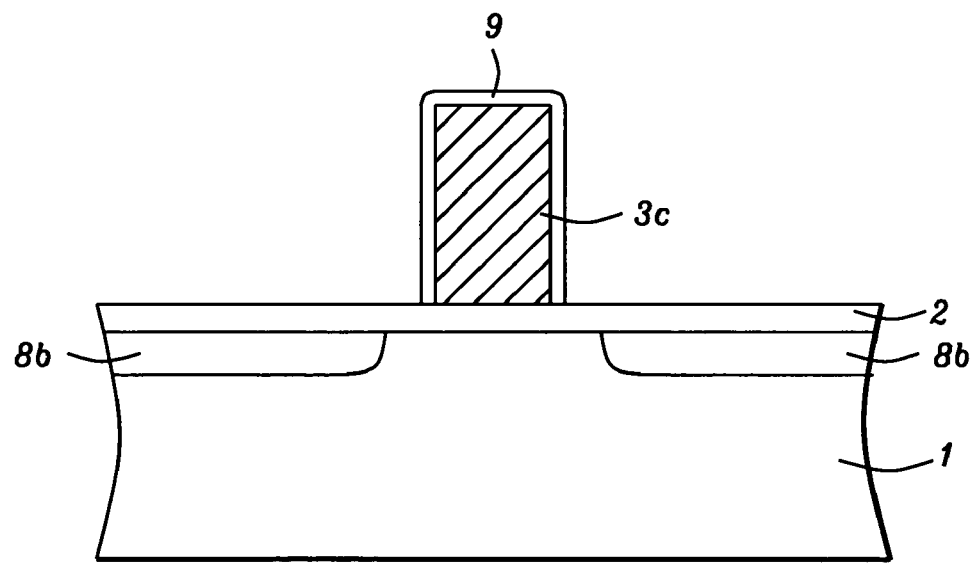

Mask shape 4b, is now selectively removed via use of a hot phosphoric acid solution. This is followed by a thermal oxidation procedure performed at a temperature between about 900 to 1100° C., in an oxygen-steam ambient, resulting in the formation of silicon oxide layer 9, at a thickness between about 10 to 30 Angstroms. The thermal cycle of the conductive gate structure reoxidation procedure allowed activation of N type ions 8a, in semiconductor substrate 1, as well as lateral diffusion of implanted dopants, to be accomplished resulting in the final desired LDD region 8b, just aligned to the portion of semiconductor substrate 1, located underlying straight walled, conductive gate structure 3c. The amount of offset of LDD implanted region 8b, from a subsequent channel region, the region underlying straight walled conductive gate structure 3c, compensates the amount of lateral diffusion of LDD dopants by thermal cycles, is between about 50 to 100 Angstroms, about half the difference in the top and bottom widths of former tapered conductive gate structure 3b. This is shown schematically in FIG. 6.

Figure 7:
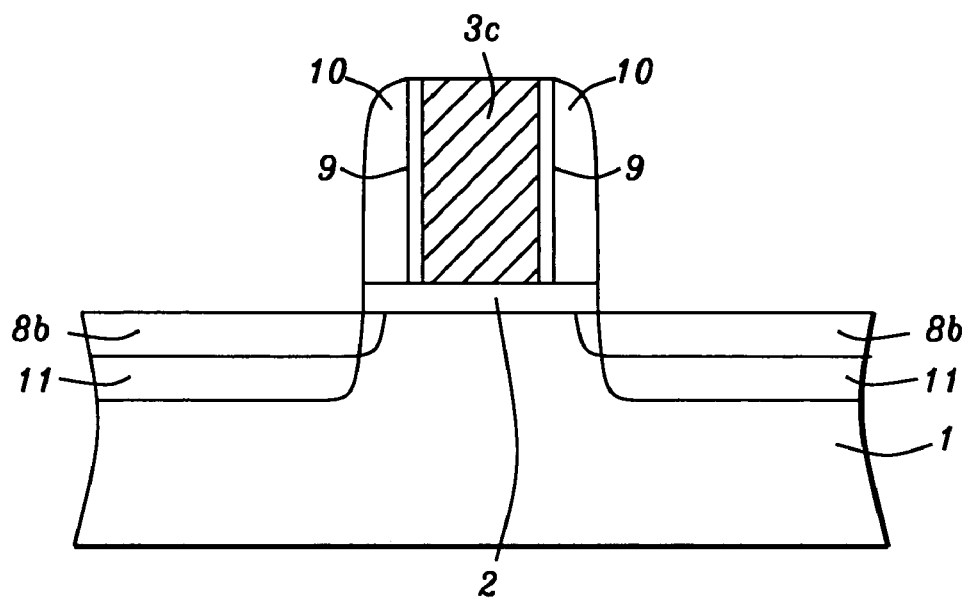
Figure 8:
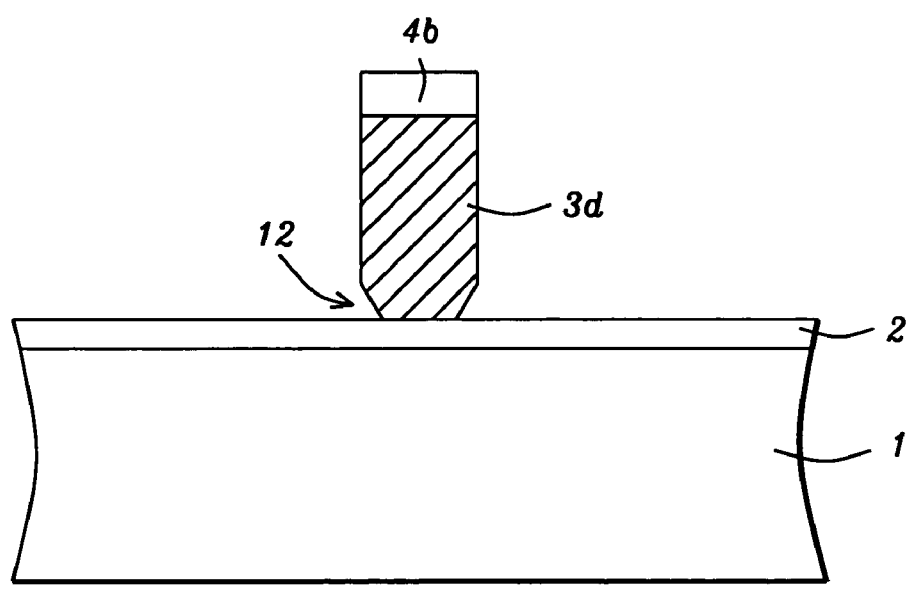
FIGS. 8–11, which schematically in cross-sectional style show a second embodiment of this invention in which a notched conductive gate structure, featuring notched or undercut portions located at the notched conductive gate structure—gate insulator interface, is used as a mask to allow definition of an LDD region to be realized in a first area of a semiconductor substrate offset from a second area of semiconductor substrate located underlying a non-notched portion of the notched conductive gate structure.

Completion of the MOSFET device, featuring the offset LDD implanted region, is next addressed and schematically shown using FIG. 7. An insulator layer such as silicon nitride, silicon oxynitride, or silicon oxide, is deposited at a thickness between about 200 to 800 Angstroms via LPCVD or PECVD procedures. A selective, anisotropic RIE procedure performed using either $CF_4$, $C_4F_8$, $CHF_3$ or $CH_2F_2$ is employed to define insulator spacers 10, on the sides of conductive gate structure 3c, wherein conductive gate structure 3c, is lined with reoxidized layer 9. The RIE procedure also removes portions of gate insulator layer 2, not covered by conductive gate structure 3c, or by insulator spacers 10. Ion implantation of arsenic or phosphorous ions, at an energy between about 30 to 100 KeV, at a dose between about 1E15 to 1E16 atoms/$cm^2$, followed by an anneal procedure used to activate the implanted ions, results in the formation of heavily doped source/drain region 11.

A second embodiment of this invention allowing a MOSFET LDD region to be formed in a first portion of semiconductor substrate, wherein the LDD implanted region is offset from a MOSFET channel region which in turn is located in a second portion of the semiconductor substrate, will now be described and schematically shown using FIGS. 8–11. Again as previously shown in the first embodiment gate insulator 2, is formed on semiconductor substrate 1, followed by deposition of a conductive gate layer and by deposition of an overlying mask layer. A photoresist shape and an anisotropic RIE procedure are employed to again define hard mask shape 4b, on the underlying conductive gate layer. Mask shape 4b, is comprised of the identical material, and defined using the same procedures, previously used to define this shape in the first embodiment of this invention. After removal of the mask shape defining photoresist shape via plasma oxygen ashing procedures, a critical dry etch procedure is employed to form conductive gate structure 3d, wherein conductive gate structure 3d, is comprised of doped polysilicon. The critical dry etch procedure, allowing a necked" or notched conductive gate structure to be defined, is a multiple step RIE procedure performed at a power between about 600 to 800 watts, at a pressure between about 5 to 15 mtorr for a first etch step, at a power between about 300 to 500 watts, at a pressure between about 10 to 20 mtorr for a second etch step, and at a power between about 600 to 900 watts, at a pressure between about 50 to 80 mtorr for the third etch step, using an etch chemistry comprised of $Cl_2$, HBr, $O_2$, $CF_4$, $N_2$ and He. Note that the addition of $N_2$ gas in the chemistry of dry etching is known to result in higher selectivity of polysilicon to oxide and plays an important role in generating notching at the bottom during the third step of the RIE procedure. The RIE conditions and chemistry selectively etch the doped polysilicon layer at a faster rate than mask shape 4b. In addition the RIE conditions and chemistry allow termination of the dry etch procedure at the appearance of the top surface of underlying gate insulator layer 2. At end point, or at the appearance of the top surface of gate insulator layer 2, deflection of the dry etchants from the surface of gate insulator layer 2, remove portions of the now defined conductive gate structure at the conductive gate structure-gate insulator interface resulting in a notched or necked region 12. Notched region 12, extends inwards between about 100 to 200 Angstroms from the vertical sides of conductive gate structure 3d. This is shown schematically in FIG. 8. The notched region of conductive gate structure 3d, will allow an offset LDD implanted region to be realized without the tapering of the conductive gate structure as previously described in the first embodiment of this invention.

Figure 9:
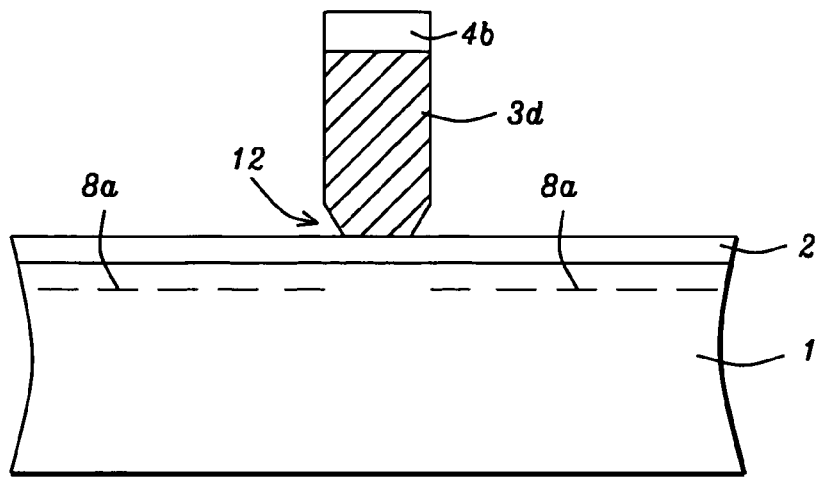
Figure 10:
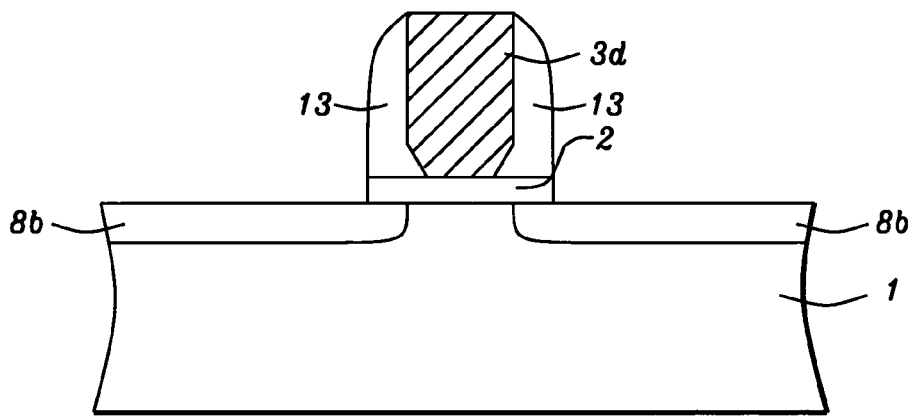

An ion implantation procedure performed using arsenic or phosphorous ions at an energy between about 3 to 10 KeV, at a dose between about 1E12 to 1E14 atoms/$cm^2$, and at a zero degree implant angle is used to place N type ions 8a, in portions of semiconductor substrate 1, not covered by the non-notched portion of conductive gate structure 4d. The zero degree low implant tilt angle prevented implantation of ions 8a, in portions of semiconductor substrate 1, directly underlying notched region 12, of conductive gate structure 3d. This is schematically shown in FIG. 9.

Figure 11:
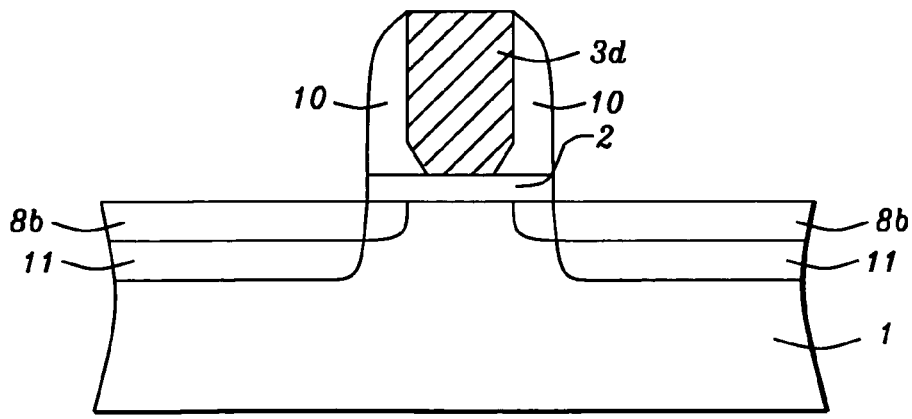

After removal of mask shape 4b, via use of a hot phosphoric acid solution, insulator spacers 13, are formed on the exposed sides of conductive gate structure 3d. This is schematically described in FIG. 10. An insulator layer such as silicon oxide, silicon nitride or silicon oxynitride is next deposited to a thickness between about 200 to 800 Angstroms, completely filling notched regions 12. The temperature used for deposition of the insulator layer via PECVD or LPCVD procedures results in activation of ions 8a, resulting in LDD regions 8b, wherein LDD region 8b, is offset from the portion of semiconductor substrate 1, located underlying the non-notched portion of conductive gate structure 3d. An anisotropic RIE procedure is then employed to define insulator spacers 13, on the sides of conductive gate structure 3d. Ion implantation of arsenic or phosphorous ions, at an energy between about 30 to 100 KeV, at a dose between about 1E15 to 1E16 atoms/$cm^2$, followed by an anneal procedure used to activate the implanted ions, results in the formation of heavily doped source/drain region 11, in portions of semiconductor substrate 1, not covered by conductive gate structure 3d, or by insulator spacers 13. This is schematically shown in FIG. 11.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal oxide semiconductor field effect transistor (MOSFET) on a semiconductor substrate, comprising the steps of:

providing a gate insulator layer, and an overlying conductive layer on said semiconductor substrate;

forming a mask shape on said conductive layer;

performing a first dry etch procedure using said mask shape to form a tapered conductive gate structure on said gate insulator layer with top surface of said conductive gate structure comprised with a smaller width than a bottom surface of said tapered conductive gate structure;

performing an ion implantation procedure to form a lightly doped source/drain (LDD) region in an area of said semiconductor substrate not covered by said tapered conductive gate structure, and to implant ions into portions of said tapered conductive gate structure, through tapered sides of said tapered conductive gate structure;

performing a second dry etch procedure having an isotropic etch component to remove portions of said tapered conductive gate structure comprised with said implanted ions resulting in a straight walled conductive gate structure, and resulting in said LDD region offset from edges of said straight walled conductive gate structure;

forming sidewall spacers on said straight walled conductive gate structure; and forming a heavily doped source/drain region in an area of said semiconductor substrate not covered by said straight walled conductive gate structure of by said sidewall spacers.

2. The method of claim 1, wherein said MOSFET device is an N channel (NMOS) device.

3. The method of claim 1, wherein said MOSFET device is a P channel (PMOS) device.

4. The method of claim 1, wherein said conductive layer is a doped polysilicon layer.

5. The method of claim 1, wherein said mask shape is comprised of silicon nitride.

6. The method of claim 1, wherein said mask shape is comprised of silicon oxynitride.

7. The method of claim 1, wherein said mask shape is comprised of silicon oxide.

8. A method of forming a metal oxide semiconductor field effect transistor (MOSFET) on a semiconductor substrate, comprising the steps of:

providing a gate insulator layer, and an overlying conductive layer on said semiconductor subtrate;

forming a mask shape on said conductive layer;

performing a first dry etch procedure using said mask shape to form a tapered conductive gate structure on said gate insulator layer with top surface of said conductive gate structure comprised with a smaller width than a bottom surface of said tapered conductive gate structure;

performing an ion implantation procedure to form a lightly doped source/drain (LDD) region in an area of said semiconductor substrate not covered by said tapered conductive gate structure, and to implant ions into portions of said tapered conductive gate structure, through tapered sides of said tapered conductive gate structure;

performing a second dry etch procedure to remove portions of said tapered conductive gate structure comprised with said implanted ions resulting in a straight walled conductive gate structure, and resulting in said LDD region offset from edges of said straight walled conductive gate structure;

forming sidewall spacers on said straight walled conductive gate structure; and forming a heavily doped source/drain region in an area of said semiconductor substrate not covered by said straight walled conductive gate structure of by said sidewall spacers;

wherein said first dry etch procedure is a reactive ion etch (RIE) procedure, performed at a power between about 300 to 800 watts, at a pressure between about 5 to 80 mtorr, using $Cl_2$, HBr, $O_2$, $CF_4$ and He as an etchant for said conductive layer.

9. The method of claim 1, wherein the width of the bottom of said tapered conductive gate structure is between about 100 to 200 Angstroms larger than the width of the top of said tapered conductive gate structure.

10. The method of claim 1, wherein said ion implantation procedure is performed using arsenic or phosphorous ions at an energy between about 3 to 10 KeV, at a dose between about 1E12 to 1E14 atoms/$cm^2$.

11. The method of claim 1, wherein said second dry etch procedure is an RIE procedure performed at a power between about 800 to 1000 watts, and at a pressure between about 50 to 100 mtorr, using $Cl_2$, HBr, $O_2$, and $N_2$ as etchants.

12. The method of claim 1, wherein said offset of said LDD region from edges of said straight walled conductive gate structure is between about 50 to 100 Angstroms.

13. The method of claim 1, wherein said sidewall spacers on said straight walled conductive gate structure are comprised of either silicon oxide or silicon nitride, at a thickness between about 200 to 800 Angstroms.

14. The method of claim 1, wherein said heavily doped source/drain region is formed via implantation of arsenic or phosphorous ions, performed at an energy between about 30 to 100 KeV, at a dose between about 1E1S to 1E16atoms/$cm^2$.

15. A method of forming a MOSFET device on a semiconductor substrate featuring an LDD region offset from a portion of said semiconductor substrate located underlying the edges of a polysilicon gate structure, comprising the steps of:

forming a gate insulator layer on said semiconductor substrate;

forming a polysilicon layer on said gate insulator layer;

forming a mask layer on said polysilicon layer;

performing a first dry etch procedure to define a mask shape from said mask layer;

performing a second dry etch procedure using said mask shape as an etch mask to define a polysilicon gate structure from said polysilicon layer, wherein said polysilicon gate structure is comprised with a top portion featuring vertical sides, and comprised with a bottom portion featuring notches or voids at polysilicon—gate insulator layer interface, with said notches in said bottom portion of said polysilicon gate structure exposing a first portion of said semiconductor substrate while non-notched area of said bottom portion of said polysilicon gate structure is located overlying a second portion of said semiconductor substrate;

performing a first ion implantation procedure to form said LDD region in a third portion of said semiconductor substrate, wherein said third portion of said semiconductor is not overlaid by said top portion of said polysilicon gate structure;

removing said mask shape;

forming insulator spacers on sides of said polysilicon gate structure filling said voids at said polysilicon—gate insulator layer interface; and performing a second ion implantation procedure to form a heavily doped source/drain region in an area of said semiconductor substrate not covered by said polysilicon gate structure or by said insulator spacers;

wherein said second dry etch procedure uses an etch chemistry that causes deflection of a dry etchant at said polysilicon—gate insulator layer interface.

16. The method of claim 15, wherein said MOSFET device is an N channel (NMOS) device.

17. The methods of claim 15, wherein said MOSFET device is a P channel (PMOS) device.

18. The method of claim 15, wherein said gate insulator layer is obtained via thermal oxidation procedures to a thickness between about 10 to 80 Angstroms.

19. The method of claim 15, wherein said polysilicon layer is a doped polysilicon layer, obtained via LPCVD procedures at a thickness between about 800 to 2000 Angstroms, and wherein said polysilicon layer is in situ doped during deposition via the addition of arsine or phosphine to a silane or to a disilane ambient.

20. The method of claim 15, wherein said mask layer is a silicon nitride layer obtained via LPCVD or via PECVD procedures at a thickness between about 200 to 800 Angstroms.

21. The method of claim 15, wherein said first dry etch procedure used to form said mask shape, is an anisotropic RIE procedure performed using either $CF_4$, $C_4F_8$, $CF_3$ or $CH_xF_2$ as an etchant.

22. A method of forming a MOSFET device on a semiconductor substrate featuring an LDD region offset from a portion of said semiconductor substrate located underlying the edges of a polysilicon gate structure, comprising the steps of:

forming a gate insulator layer on said semiconductor substrate;

forming a polysilicon layer on said gate insulator layer;

forming a mask layer on said polysilicon layer;

performing a first dry etch procedure to define a mask shape from said mask layer;

performing a second dry etch procedure using said mask shape as an etch mask to define a polysilicon gate structure from said polysilicon layer, wherein said polysilicon gate structure is comprised with a top portion featuring vertical sides, and comprised with a bottom portion featuring notches or voids at polysilicon—gate insulator layer interface, with said notches in said bottom portion of said polysilicon gate structure exposing a first portion of said semiconductor substrate while non-notched area of said bottom portion of said polysilicon gate structure is located overlying a second portion of said semiconductor substrate;

performing a first ion implantation procedure to form said LDD region in a third portion of said semiconductor substrate, wherein said third portion of said semiconductor is not overlaid by said top portion of said polysilicon gate structure;

removing said mask shape;

forming insulator spacers on sides of said polysilicon gate structure filling said voids at said polysilicon—gate insulator layer interface; and performing a second ion implantation procedure to form a heavily doped source/drain region in an area of said semiconductor substrate not covered by said polysilicon gate structure or by said insulator spacers;

wherein said second dry etch procedure used to define said polysilicon gate structure, is an RIE procedure performed at a power between about 300 to 900 watts, at a pressure between about 5 to 80 mtorr, using an etch chemistry comprised of $Cl_2$, HBr, $O_2$, $CF_4$, $N_2$ and He.

23. The method of claim 15, wherein said notches located in said bottom portion of said polysilicon gate structure, extends inwards between about 150 to 200 Angstroms from the vertical sides of said top portion of said polysilicon gate structure.

24. The method of claim 15, wherein said first ion implantation procedure used to form said LDD region, is performed using arsenic or phosphorous ions at an energy between about 3 to 10 KeV, at a dose between about 1E12 to 1E14 atoms/cm$^2$, and at an implant angle of 0 degrees.

25. The method of claim 15, wherein said mask shape is removed using a hot phosphoric acid solution.

26. The method of claim 15, wherein said insulator spacers on sides of said polysilicon gate structure are comprised of either silicon oxide or silicon nitride, at a thickness between about 200 to 800 Angstroms.

27. The method of claim 15, wherein said second ion implantation procedure used to form said heavily doped source/drain region is performed using arsenic or phosphorous ions, at an energy between about 30 to 100 KeV, at a dose between about 1E15 to 1E16 atoms/cm$^2$.

* * * * *